(12) United States Patent
Song et al.

(10) Patent No.: US 8,933,472 B2
(45) Date of Patent: Jan. 13, 2015

(54) ARRAY SUBSTRATE AND DISPLAY DEVICE COMPRISING THE SAME

(71) Applicant: BOE Technology Group Co., Ltd., Beijing (CN)

(72) Inventors: Youngsuk Song, Beijing (CN); Seongyeol Yoo, Beijing (CN); Seungjin Choi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/996,318

(22) PCT Filed: Jan. 9, 2013

(86) PCT No.: PCT/CN2013/070240
§ 371 (c)(1),
(2) Date: Jun. 20, 2013

(87) PCT Pub. No.: WO2013/104300
PCT Pub. Date: Jul. 18, 2013

(65) Prior Publication Data
US 2014/0209913 A1    Jul. 31, 2014

(30) Foreign Application Priority Data

Jan. 12, 2012    (CN) .......................... 2012 2 0013681

(51) Int. Cl.
*H01L 29/20*    (2006.01)
*H01L 33/00*    (2010.01)
(Continued)

(52) U.S. Cl.
CPC .......... *H01L 27/1214* (2013.01); *G02F 1/1362* (2013.01); *H01L 29/78633* (2013.01); *H01L 27/1248* (2013.01); *G02F 2001/136222* (2013.01); *G02F 2201/48* (2013.01)
USPC ............................................. 257/89; 257/72

(58) Field of Classification Search
USPC ........................................................ 257/89
See application file for complete search history.

(56) References Cited

U.S. PATENT DOCUMENTS

| 6,281,960 B1 * | 8/2001 | Kishimoto et al. ........... 349/156 |
| 6,542,209 B2 * | 4/2003 | Kim et al. ..................... 349/106 |

(Continued)

FOREIGN PATENT DOCUMENTS

| CN | 1373390 A | 10/2002 |
| CN | 101034215 A | 9/2007 |

(Continued)

OTHER PUBLICATIONS

International Preliminary Report on Patentability for International Application No. PCT/CN2013/070240 dated Jul. 15. 2014, 8pgs.

(Continued)

*Primary Examiner* — Yu-Hsi D Sun
*Assistant Examiner* — Grant Withers (57) ABSTRACT

An array substrate, which is formed with a gate electrode (2), a source electrode (5), a drain electrode (6), a gate insulating layer (3), an active layer (4) and a passivation layer (9) in a thin film transistor region, and with the gate insulating layer (3), a pixel electrode (7), the passivation layer (9) and a common electrode (8) in a pixel electrode pattern region, and a color resin layer (11) is formed between the passivation layer (9) and the common electrode (8). Since the color resin layer (11) for planarization is formed on the passivation layer (9), the horizontal driving manner may be suitably applied in order to reduce light leakage, to improve contrast ratio and aperture ratio of a panel and to lower production costs.

7 Claims, 6 Drawing Sheets

(51) Int. Cl.
*H01L 27/12* (2006.01)
*G02F 1/1362* (2006.01)
*H01L 29/786* (2006.01)

(56) References Cited

U.S. PATENT DOCUMENTS

| | | | |
|---|---|---|---|
| 7,439,089 B2* | 10/2008 | Kim | 438/30 |
| 7,522,226 B2* | 4/2009 | Park et al. | 349/43 |
| 7,858,452 B2* | 12/2010 | Park | 438/149 |
| 7,964,879 B2* | 6/2011 | Yamazaki | 257/80 |
| 8,237,179 B2* | 8/2012 | Yamazaki et al. | 257/89 |
| 8,368,297 B2* | 2/2013 | Kim | 313/504 |
| 8,471,276 B2* | 6/2013 | Lee et al. | 257/89 |
| 2002/0018159 A1* | 2/2002 | Kim et al. | 349/106 |
| 2004/0012725 A1 | 1/2004 | Tomioka et al. | |
| 2004/0179153 A1* | 9/2004 | Yeh et al. | 349/106 |
| 2010/0163879 A1* | 7/2010 | Jung et al. | 257/59 |
| 2011/0013130 A1* | 1/2011 | Choi et al. | 349/141 |
| 2011/0114964 A1* | 5/2011 | Shibata et al. | 257/72 |
| 2011/0133666 A1* | 6/2011 | Arai | 315/291 |
| 2012/0138972 A1* | 6/2012 | Li et al. | 257/88 |
| 2014/0054581 A1* | 2/2014 | Song et al. | 257/43 |
| 2014/0055879 A1* | 2/2014 | Wang et al. | 359/891 |
| 2014/0078452 A1* | 3/2014 | Lu et al. | 349/106 |
| 2014/0085577 A1* | 3/2014 | Zhou | 349/106 |
| 2014/0125909 A1* | 5/2014 | Kim et al. | 349/46 |
| 2014/0159070 A1* | 6/2014 | Hoka et al. | 257/88 |
| 2014/0209913 A1 | 7/2014 | Song et al. | |

FOREIGN PATENT DOCUMENTS

| | | |
|---|---|---|
| CN | 101109883 A | 1/2008 |
| CN | 20240339 U | 8/2012 |

OTHER PUBLICATIONS

International Search Report for International Application No. PCT/CN2013/070240 dated Apr. 18, 2013, 14pgs.

* cited by examiner

ARRAY SUBSTRATE AND DISPLAY DEVICE COMPRISING THE SAME

CROSS REFERENCE TO RELATED APPLICATIONS

This application is based on International Application No. PCT/CN2013/070240 filed on Jan. 9, 2013, which claims priority to Chinese National Application No. 201220013681.1, filed on Jan. 12, 2012, the contents of which are incorporated herein by reference.

TECHNICAL FIELD

Embodiments of the present invention relate to an array substrate and a display device comprising the array substrate.

BACKGROUND

With such characteristics as small volume, low power consumption and less radiation, Thin Film Transistor Liquid Crystal Displays (TFT-LCDs) have dominated the current market of flat panel displays. With the development of technology, customers have placed more requirements on the display effect of the mobile products. The ordinary Twisted Nematic (TN) type liquid crystal displays have become inadequate to meet the requirements of the market with regard to the display effect.

At present, many manufacturers gradually apply the various wide viewing-angle technologies which have better display effects for the mobile products, e.g., In-Plane-Switching (IPS), Vertical Alignment (VA), Advanced Super Dimension Switch (AD-SDS, or simplified as ADS) technologies and the like. With the ADS mode, a multi-dimensional electric field is formed with an electric field produced at edges of slit electrodes on a same plane and an electric field produced between a layer of the slit electrodes and a layer of a plate-like electrode so as to allow liquid crystal molecules at all orientations within a liquid crystal cell, which are located between the slit electrodes and directly above the slit electrodes, to be rotated, thereby enhancing the work efficiency of liquid crystals and increasing the light transmittance. Thus, the ADS technology can improve the picture quality of the TFT-LCDs, and has advantages such as high transmittance, wide viewing angle, high aperture ratio, low chromatic aberration, low response time, no push Mura, and etc.

Figure 1:
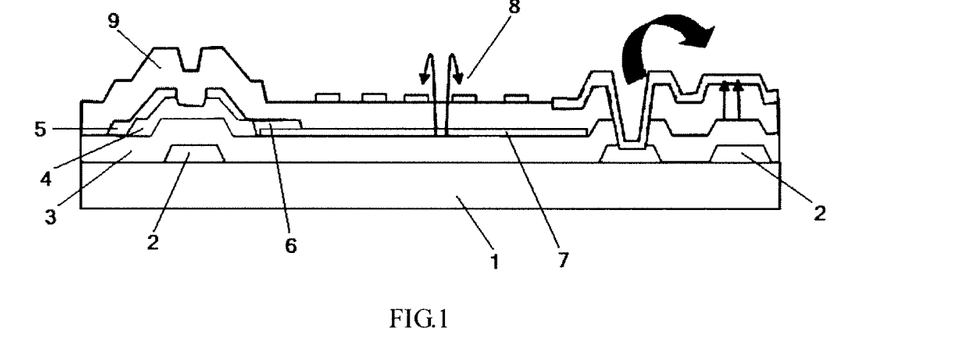
FIG. 1 is a cross-sectional schematic view of the array substrate with the current ADS mode.

FIG. 1 shows a TFT array substrate structure with the current ADS mode, in which a cross-sectional schematic view of a pixel region is shown. In the array substrate, the lowest layer is a glass substrate 1, and a gate electrode 2, an insulating layer 3, an active layer 4 are sequentially formed on the glass substrate 1. A drain electrode 5 and a source electrode 6 are formed on the active layer 4. In a direction of the light transmission (i.e., the vertical direction in the figure), regions related to the drain electrode 5 and the source electrode 6 constitute a thin film transistor (TFT) region in a pixel region. A pixel electrode 7 (which may be deemed as a plate-like electrode) is formed on the insulating layer 3 and contacts the drain electrode 5. The source electrode 6 and a data line (not shown) are formed integrally. A passivation layer 9 is formed on the drain electrode 5, the source electrode 6 and the pixel electrode 7, and a common electrode 8 (which may be deemed as a slit electrode) is formed on the passivation layer 9. In the direction of the light transmission, regions related to the pixel electrode 7 and the common electrode 8 constitute a pixel electrode pattern region (or called as "display region").

Figure 2:
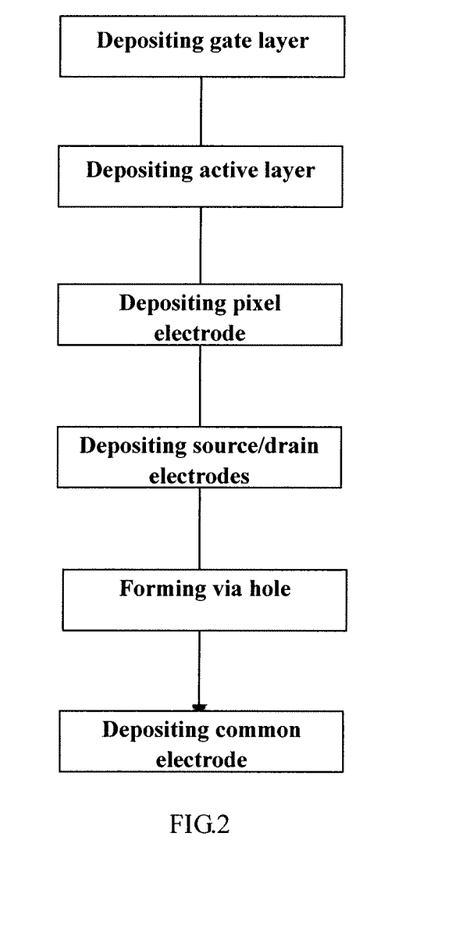
FIG. 2 is a flow chart for manufacturing the array substrate shown in FIG. 1.

A process for manufacturing the structure of the aforesaid array substrate is generally shown in FIG. 2. When the structure is applied to small-sized mobile products, the aperture ratio will be increased to a certain extent because there is no via hole in a pixel. But since an additional color filter substrate is required thereon, the bonding of the manufacturing process will lead to lowered aperture ratio due to the bonding condition of the edges.

In addition, it can be seen from FIG. 1 that a step exists between the TFT structure and an upper surface of the data line (the source electrode 6). Apparently, the step hamper the application of horizontal driving in the ADS mode, so the liquid crystal can not be normally driven here, thus causing light leakage and lowered contrast ratio (CR).

SUMMARY

With respect to the situation in the conventional technology that the liquid crystal molecules can not be horizontally driven due to the step between layers in the pixel, the embodiments of the present invention resolve the problem of light leakage and deteriorated contrast ratio because of disclination.

One aspect of the present invention provides an array substrate comprising a gate line and a data line that define a pixel region including a thin film transistor region and a pixel electrode pattern region; in the thin film transistor region a gate electrode, a source electrode, a drain electrode, a gate insulating layer, an active layer and a passivation layer are provided, and a channel part is formed between the source electrode and the drain electrode and recessed to the inner of the active layer; in the pixel electrode pattern region the gate insulating layer, a pixel electrode, the passivation layer and a common electrode are formed, and a multi-dimensional electric field is formed between the common electrode and the pixel electrode when the common electrode and the pixel electrode are applied voltages; and a color resin layer is formed between the passivation layer and the common electrode.

As for the array substrate, e.g., the pixel electrode is formed on the surface of the active layer in a position other than the channel part, and extends to cover the gate insulating layer in the pixel electrode pattern region; in the thin film transistor region, the drain electrode and the source electrode are formed on the pixel electrode.

As for the array substrate, e.g., in the thin film transistor region, the source electrode and the drain electrode are formed on the active layer; at a joint part of the pixel electrode pattern region and the thin film transistor region, one end of the pixel electrode is lap-jointed onto one end of the source electrode.

As for the array substrate, e.g., the color resin layer is made of a material having a dielectric constant of 3~5 F/m and a thickness of 0.5 μm~2 μm.

As for the array substrate, e.g., the pixel electrode and the common electrode are each made of a transparent conductive material.

As for the array substrate, e.g., in the thin film transistor region, a black matrix layer is formed on the passivation layer.

As for the array substrate, e.g., the black matrix layer is an opaque resin layer, which is made of a material having a surface resistance greater than $10^{12}$ Ω/sq, a thickness of 0.5 μm~2 μm and an optical density greater than 4.

In addition, another aspect of the present invention further provides a display device, which comprises an array substrate of any one of the aforesaid array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not (imitative of the invention.

REFERENCE SIGNS

1—glass substrate; 2—gate electrode; 3—gate insulating layer; 4—active layer; 5—drain electrode; 6—source electrode; 7—pixel electrode; 8—common electrode; 9—passivation layer; 10—black matrix layer; 11—color resin layer; 21—gate line; 22—data line; 200—array substrate; 300—opposed substrate; 350—seal agent; 400—liquid crystal material.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, the technical or scientific terms used herein shall have the general meanings understandable for those ordinarily skilled in the field of the present invention. The words such as "a", "an", "the" or similar shall not represent limitation of numbers, but mean existence of at least one. The phrases such as "include", "comprise" or similar intend to mean the elements or objects before such words cover or are equivalent to the elements or objects listed after such words, but other elements or objects are not exclusive. The phrases such as "connect", "connected" or similar are not limited to physical or chemical connection, but also include electrical connection, no matter directly or indirectly. The phrases such as "upper", "lower", "left", "right" and etc. shall be used only to represent relative positions, wherein when the absolute position of the described object is changed, the relative positions may be changed accordingly.

The array substrate in an embodiment of the present invention comprises a plurality of gate lines and a plurality of data lines which intersect each other to define pixel regions arranged in a matrix, each of the pixel regions comprising a thin film transistor as a switching element, and a pixel electrode and a common electrode for forming a driving electric field. For example, in each pixel, a gate electrode of the thin film transistor is electrically connected to or integrally formed with a corresponding gate line, a source electrode is electrically connected to or integrally formed with a corresponding data line, and a drain electrode is electrically connected to or integrally formed with a corresponding pixel electrode. The following description is mainly connected with one or more pixel regions, but other pixel regions may be formed similarly.

Embodiment 1

Figure 3:
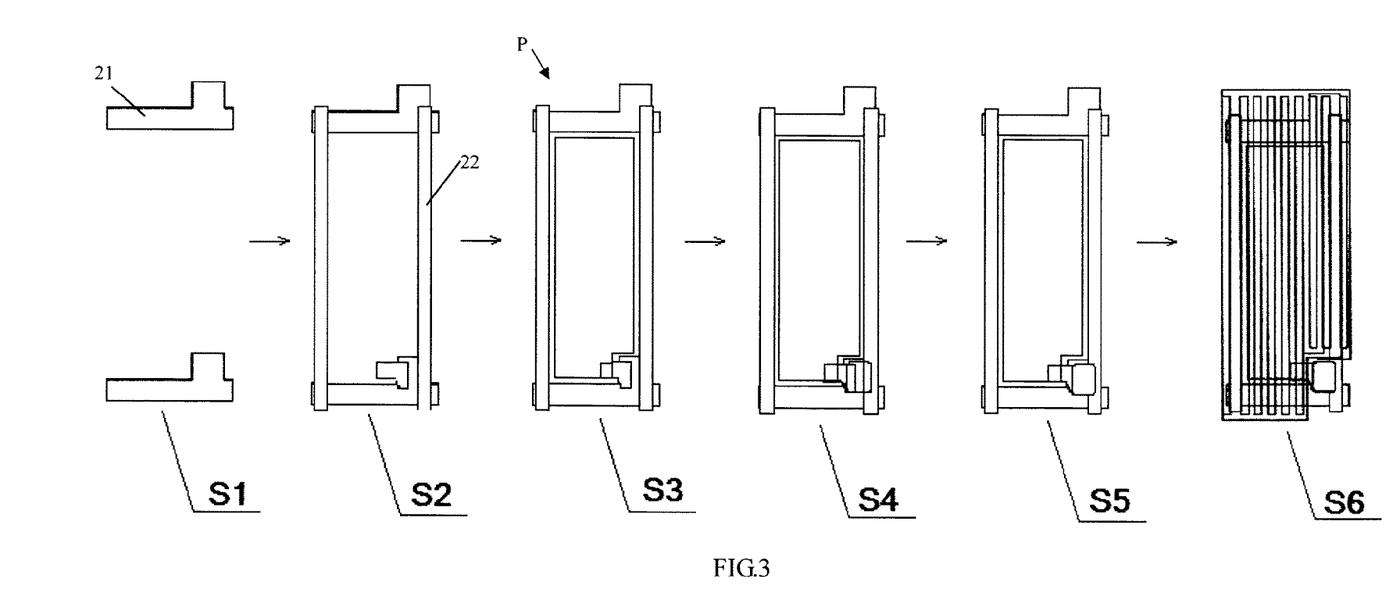
FIG. 3 is a schematic top view of the array substrate of Embodiment 1 during the manufacturing process.
Figure 4:
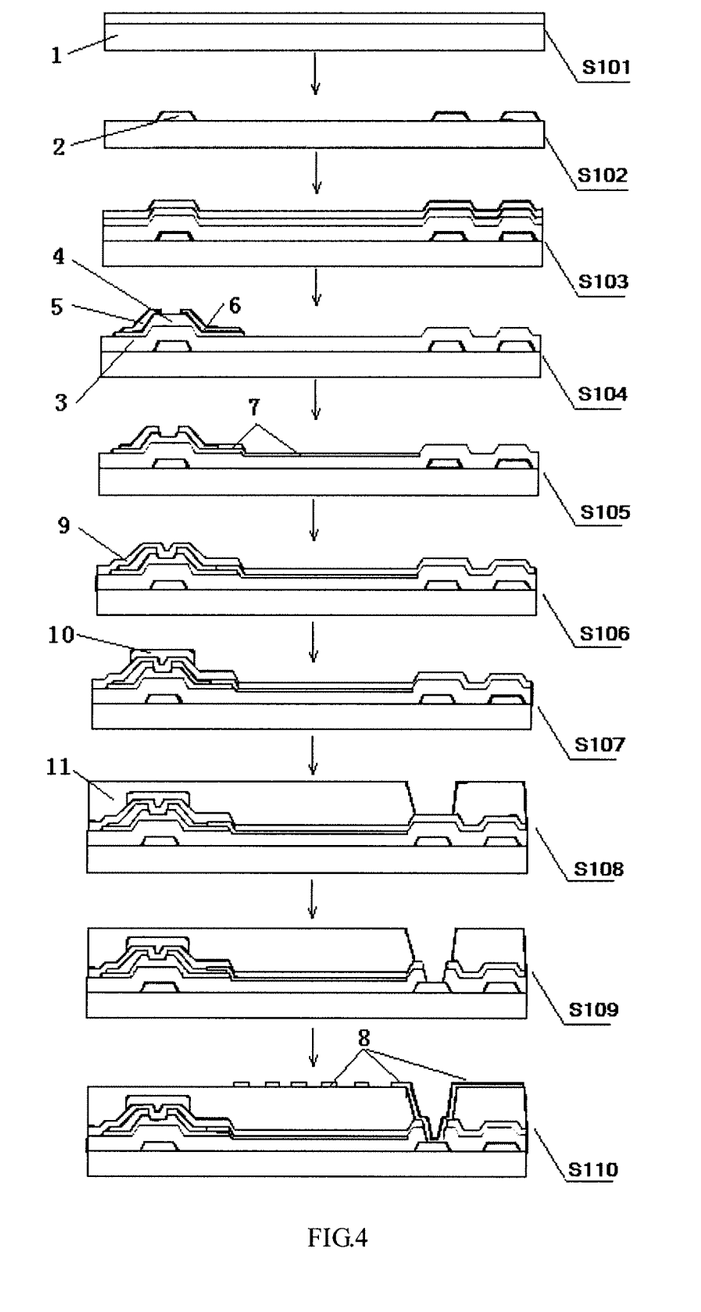
FIG. 4 is a sectional schematic view of the array substrate of Embodiment 1 during the manufacturing process.

The present embodiment provides an array substrate, to which the ADS mode may be applied. As shown in FIG. 3 and FIG. 4, the array substrate comprises gate lines 21 and data lines 22 defining a plurality of pixel regions P on a base substrate (for example a glass or plastic substrate), each of the pixel regions comprising a thin film transistor region and a pixel electrode pattern region.

A gate electrode 2, a gate insulating layer 3, an active layer 4, a source electrode 5, a drain electrode 6, and a passivation layer 9 are formed in the thin film transistor region. A channel part is formed between the source electrode 5 and the drain electrode 6 and recessed to the inner of the active layer 4. The gate 2 and the gate lines 21 are integrally formed, and the drain electrode 6 and the data lines 22 are integrally formed.

The gate insulating layer 3, a pixel electrode 7, a passivation layer 9 and a common electrode 8 are formed in the pixel electrode pattern region defined by the regions formed with the common electrode 8 and the pixel electrode 7. A multi-dimensional electric field is formed between the common electrode 8 and the pixel electrode 7 after they are applied voltages. A color resin layer 11 is formed between the passivation layer 9 and the common electrode 8. In the thin film transistor region corresponding to the pixel electrode pattern region, a black matrix layer 10 is formed on the passivation layer 9.

In the thin film transistor region, the source electrode 5 and the drain electrode 6 are formed on the active layer 4. At a joint part of the pixel electrode pattern region and the thin film transistor region, one end of the pixel electrode 7 is lap jointed onto one end of the source electrode 5.

The active layer 4 may comprise a silicon semiconductor layer such as amorphous silicon, or comprise an oxide semiconductor layer, and an ohmic contact layer may be further formed on a side of the semiconductor material layer adjacent to the source and drain electrodes.

The materials for the pixel electrode 7 and the common electrode 8 may be metals for forming the gate electrodes and the data lines, e.g., Mo, Al, Ti, Cu and other metals with good conductivity or alloys thereof, or transparent conductive material with etching selectivity, e.g., nano amorphous Indium Tin Oxide (a-ITO), Indium Zinc Oxide (IZO), and etc. These materials can become metallic material with good transparency after Transparent Conducting Oxide (TCO) processing. Such metallic materials (e.g. a-ITO, IZO) and metals for wiring (Mo, Al, . . . ) are materials that can be selected for wet etching.

The resin layer 11 may be made of a material having a dielectric constant of 3~5 F/m and a thickness of 0.5 μm~2 μm. Resin layers in different pixel regions may be of different colors, e.g. red, green and blue (RGB) respectively, or a combination of other colors, e.g. further comprising white (W) color. These color resin layers may adopt resin materials with added pigments that are known in the relevant field.

The black resin layer 10 may be an opaque resin layer, which is made of a material having a surface resistance greater than $10^{12}$ Ω/sq, a thickness of 0.5 μm~2 μm and an optical density greater than 4, and e.g. may be an opaque metal oxide.

According to the aforementioned structure, an example of the manufacturing process of the array substrate structure with the ADS mode will be described below in detail. With reference to FIG. 3 and FIG. 4, the process may be summarized as follows firstly, forming a pattern comprising a gate line, a gate electrode, a gate insulating layer, an active layer, a source electrode and a drain electrode, to form a thin film transistor region; then, forming a pattern comprising a color resin layer; finally, forming a pattern comprising a pixel electrode, a data line, a passivation layer and a common electrode, to form a pixel electrode pattern region. With reference to the steps S1-S6 shown in FIG. 3 and the steps S101-S110 shown in FIG. 4, the example comprises the following steps in detail Step S1: corresponding to steps S101 and S102, depositing on the glass substrate 1 a first metal layer with good conductivity, etching the first metal layer by a first mask process using a single-tone mask plate so as to form a gate line and a gate electrode 2;

Step S2: corresponding to steps S103 and S104, sequentially depositing on the resultant structure a gate insulating layer 3 of such a material as SiNx or SiON and a semiconductor active layer 4 of such a material as a-Si or the like; depositing on the formed substrate a second metal layer with good conductivity, obtaining photoresist patterns corresponding to the source electrode 5, the drain electrode 6 and the thin film transistor channel part by a second mask process using a halftone mask plate or a double-tone mask plate, and then etching the second metal layer by successive etching processes and an ashing process to form the source electrode 5 and the drain electrode 6, thus forming the thin film transistor region;

Step S3: corresponding to step S105, depositing on the above structure a third metal layer that is transparent and has good conductivity, forming the pixel electrode 7 by e.g. a third mask process using a single-tone mask and successive etching processes; afterwards, partially etching a portion of the semiconductor layer corresponding to the TFT channel part; in this case, since the etching on the portion of the semiconductor layer corresponding to the TFT channel part is performed after the step of forming the pixel electrode 7 by etching in the third mask process, the adverse effect of the subsequent process on the TFT channel thus can be avoided;

Step S4: corresponding to steps S106 and S107, depositing a SiNx passivation layer 9 to protect the TFT part and the pixel part in the above structure; on a TFT upper part and around the surface plate of the substrate, depositing a black matrix layer 10 of an opaque mask resin by a fourth mask process using a single-tone mask plate, and manufacturing the patterns of the passivation layer 9;

Step S5: corresponding to steps S108 and S109, depositing on the above structure a resin layer, and forming e.g. an RGB color resin layer 11 by continuous the fifth mask process, the sixth mask process and the seventh mask process using single-tone mask plates; depositing a SiNx layer on the above resultant substrate, and forming, by a eighth mask process, a via hole for connecting the common electrode 8 with a storage capacitor bottom electrode formed by the gate metal at a lower part;

Step S6: corresponding to S110, depositing on the above structure a fourth metal layer that is transparent and has good conductivity, forming the transparent common electrode 8 by e.g. a ninth mask process using a single-tone mask and successive etching processes.

Figure 5:
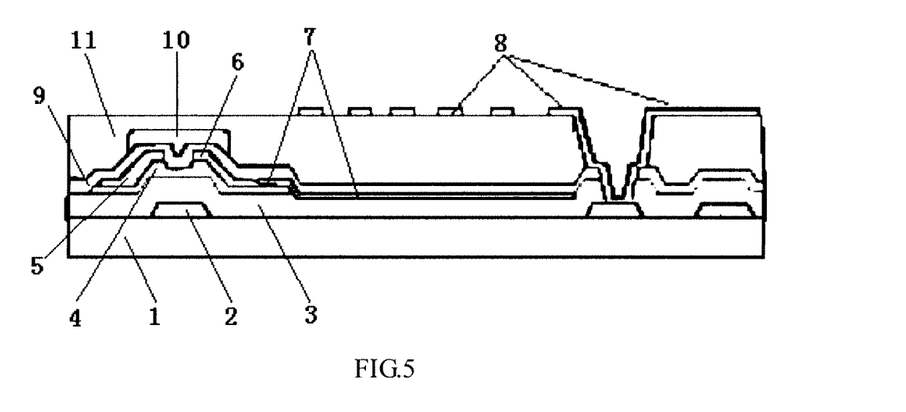
FIG. 5 is a sectional schematic view of the array substrate of Embodiment 1.

Finally, the array substrate as shown in FIG. 5 is formed, in which a cross-sectional view of a pixel region is shown.

Embodiment 2

Figure 6:
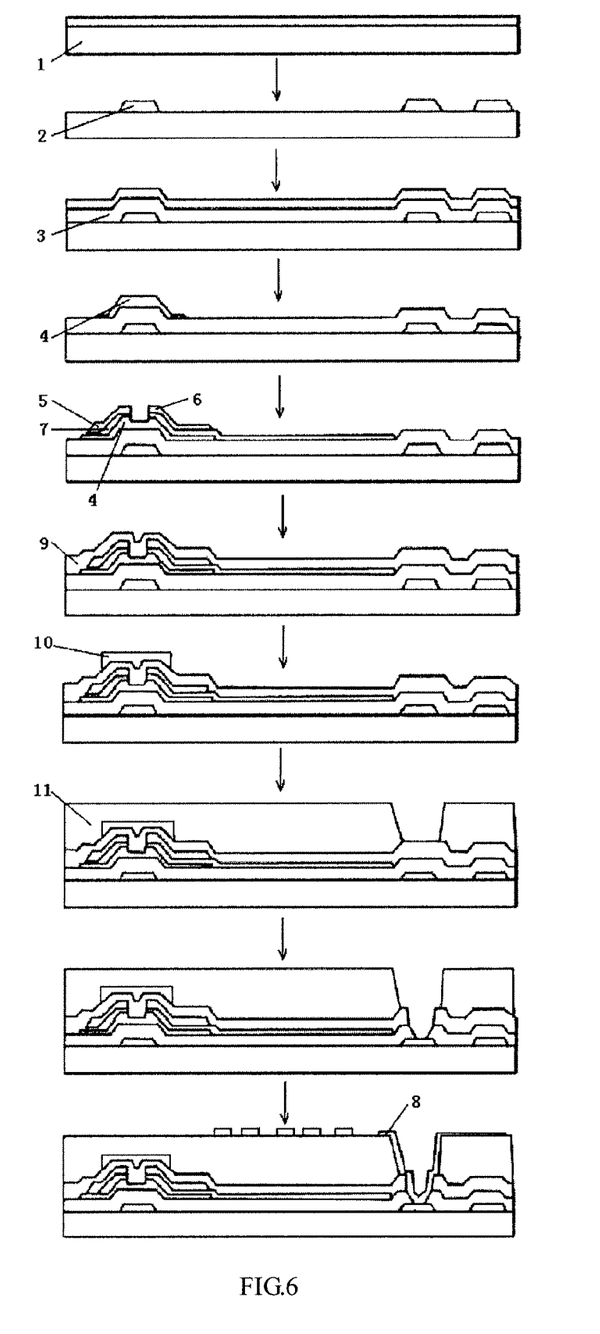
FIG. 6 is a sectional schematic view of the array substrate of Embodiment 2 during the manufacturing process.
Figure 7:
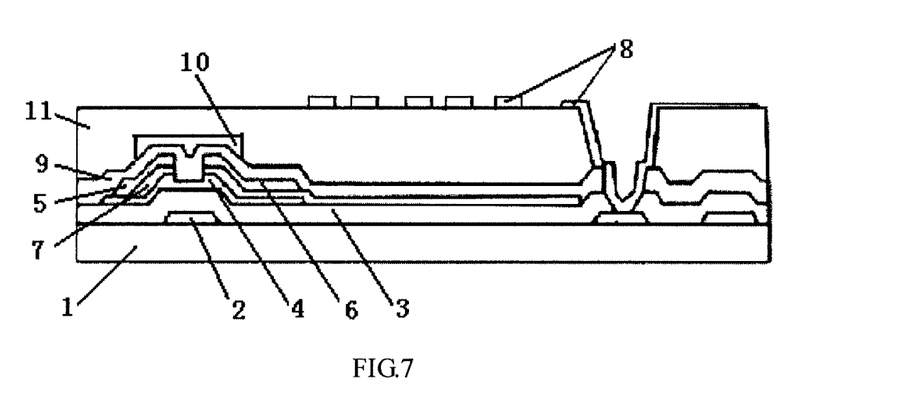
FIG. 7 is a sectional schematic view of the array substrate of Embodiment 2.

The present embodiment provides another array substrate with the ADS mode. As shown in FIG. 6 and FIG. 7, the array substrate comprises gate lines and data lines defining a plurality of pixel regions on a base substrate (for example glass or plastic substrate), each of the pixel regions comprising a thin film transistor region and a pixel electrode pattern region. The thin film transistor comprises a gate electrode 2, a gate insulating layer 3, an active layer 4, a source electrode 5, a drain electrode 6, and a passivation layer 9. A channel part is formed between the source electrode 5 and the drain electrode 6 and recessed to the inner of the active layer 4. The gate insulating layer 3, a pixel electrode 7, a passivation layer 9 and a common electrode 8 are formed in the pixel electrode pattern region defined by the regions formed with the common electrode 8 and the pixel electrode 7. A multi-dimensional electric field is formed between the common electrode 8 and the pixel electrode 7 when the common electrode and the pixel electrode are applied voltages. A color resin layer 11 is formed between the common electrode 8 and the passivation layer 9. In the thin film transistor region corresponding to the pixel electrode pattern region, a black matrix layer 10 is formed on the passivation layer 9.

The pixel electrode 7 is formed on the surface of the active layer 4 in a the position other than the channel part, and extends to cover the gate insulating layer 3 in the pixel electrode pattern region; in the thin film transistor region, the drain electrode 5 and the source electrode 6 are formed on the pixel electrode 7.

The common steps in the manufacturing flowcharts of FIG. 4 and FIG. 6 are not described anymore herein. The difference lies in the position of the pixel electrode 7 relative to the drain electrode 5 and the source electrode 6. When the pixel electrode 7 is below the source electrode 6, the pixel electrode 7 and the source electrode 6 may be completed in a single mask process, and therefore there is great difference between the embodiments in process. In FIG. 4, the manufacturing process is performed in the order of gate electrode 2-active layer 3-drain electrode 5 and source electrode 6-pixel electrode 7- . . . , while in FIG. 6, the manufacturing process is performed in the order of the gate electrode 2-active layer 3-pixel electrode 7-drain electrode 5 and source electrode 6- . . . .

The layers in Embodiment 2 may be made of the materials for the corresponding layers in Embodiment 1.

Compared with the conventional technology as shown in FIG. 1 and FIG. 2, the array substrate provided in the embodiments of the present invention has the following advantages:

(1) Only nine mask processes are required to complete the ADS mode array substrate integrated with the color filters;

(2) By manufacturing the patterns of color resin for planarization on the upper part of the TFT passivation layer, the step between the TFT and the data line is eliminated, and the deviation of light rays is eliminated by twisting of partial liquid crystal in the liquid crystal alignment. Thus, the ADS mode of a horizontal driving manner may be normally driven, and therefore the contrast ratio is improved;

(3) The problem of lowered aperture ratio caused by bonding the existing array substrate and the color filter substrate may be prevented. High aperture ratio can be maintained, and thus high transmittance can be maintained because of the structure having high aperture ratio (overlapping of the data lines and common lines);

(4) The connection hole in the pixel structure further improves the aperture ratio; and, not only the manufacturing of large-scale panels but also that of small-scale panels are facilitated.

Embodiment 3

Furthermore, Embodiment 3 of the present invention provides a display device, which comprises an array substrate according to any one of the aforementioned embodiments. The display device may be a liquid crystal panel, an e-paper device, an OLED panel, a liquid crystal television, a liquid crystal display, a digital photo frame, a mobile phone, a tablet PC, and other products or components having display function.

Figure 8:
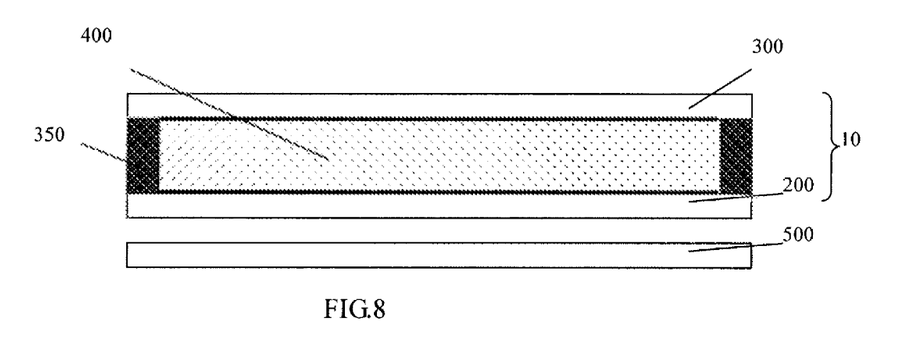
FIG. 8 is a sectional schematic view of the liquid crystal display device of Embodiment 3.

One example of the display device is a liquid crystal display device. As shown in FIG. 8, the liquid crystal display device comprises an array substrate 200 and an opposed substrate 300, which are disposed opposite to each other and are sealed with a seal agent 350 at the periphery portion so as to form a liquid crystal cell, in which a liquid crystal material 400 is filled. The array substrate 200 may be an array substrate of Embodiment 1 or 2, the pixel electrode in each pixel region being used to apply an electric field for controlling the rotation degree of the liquid crystal material so as to perform a display operation. The opposed substrate 300 may be a white glass substrate or a plastic substrate. The liquid crystal display device may further comprise a backlight source 500 for providing the array substrate with backlight.

The above embodiments of the present invention are given by way of illustration-only and thus are not limitative for the protection scope of the present invention, which is determined by the attached claims.

The invention claimed is:

1. An array substrate, comprising a gate line and a data line that define a pixel region including a thin film transistor region and a pixel electrode pattern region, wherein in the thin film transistor region a gate electrode, a source electrode, a drain electrode, a gate insulating layer, an active layer and a passivation layer are provided, and a channel part is formed between the source electrode and the drain electrode and recessed to the inner of the active layer; in the pixel electrode pattern region the gate insulating layer, a pixel electrode, the passivation layer and a common electrode are formed, and a multi-dimensional electric field is formed between the common electrode and the pixel electrode when the common electrode and the pixel electrode are applied voltages, wherein a color resin layer is formed between the passivation layer and the common electrode, and wherein the color resin layer is made of a material having a dielectric constant of 3~5 F/m and a thickness of 0.5 μm~2 μm.

2. The array substrate according to claim 1, wherein the pixel electrode is formed on the surface of the active layer in a position other than the channel part and extends to cover the gate insulating layer in the pixel electrode pattern region;

in the thin film transistor region, the drain electrode and the source electrode are formed on the pixel electrode.

3. The array substrate according to claim 1, wherein in the thin film transistor region, the source electrode and the drain electrode are formed on the active layer; and at a joint part of the pixel electrode pattern region and the thin film transistor region, one end of the pixel electrode is lap jointed onto one end of the source electrode.

4. The array substrate according to claim 1, wherein the pixel electrode and the common electrode are each made of a transparent conductive material.

5. The array substrate according to claim 1, wherein in the thin film transistor region, a black matrix layer is formed on the passivation layer.

6. The array substrate according to claim 5, wherein the black matrix layer is an opaque resin layer, which is made of a material having a surface resistance greater than $10^{12}$ Ω/sq, a thickness of 0.5 μm~2 μm and an optical density greater than 4.

7. A display device, comprising an array substrate according to claim 1.

* * * * *